United States Patent [19]

Laub

[11] Patent Number: 5,364,278
[45] Date of Patent: Nov. 15, 1994

[54] ELECTRONIC COMPONENT UPGRADE CONNECTOR AND CONTACT

[75] Inventor: Michael F. Laub, Etters, Pa.

[73] Assignee: The Whitaker Corporation, Wilmington, Del.

[21] Appl. No.: 27,994

[22] Filed: Mar. 8, 1993

[51] Int. Cl.$^5$ .............................................. H01R 9/09
[52] U.S. Cl. .......................................... 439/69; 439/73
[58] Field of Search ................ 439/68, 69, 70, 71, 439/73, 331

[56] References Cited

U.S. PATENT DOCUMENTS

| | | |
|---|---|---|
| 4,192,565 | 3/1980 | Gianni . |
| 4,427,249 | 1/1984 | Bright et al. ............... 439/331 X |
| 4,671,592 | 6/1987 | Ignasiak et al. ............... 439/331 |
| 4,696,525 | 9/1987 | Coller et al. ............... 439/69 |
| 4,996,476 | 2/1991 | Balyasny et al. ............... 439/264 X |
| 5,073,116 | 12/1991 | Beck, Jr. ............... 439/71 |
| 5,166,609 | 11/1992 | Cole et al. ............... 324/158 F |
| 5,318,451 | 6/1994 | DelPrete et al. ............... 439/69 |

FOREIGN PATENT DOCUMENTS 0096753 6/1984 Japan ............... 439/69

Primary Examiner—Khiem Nguyen
Attorney, Agent, or Firm—Driscoll A. Nina, Jr.

[57] ABSTRACT

A connector and contact for electrically interconnecting terminals of an upgraded circuit module directly to the leads of a pre-existing electronic component affixed to contact pads on a substrate through a separable connection, the connector having a frame upon which contacts are retainably positioned to form the interconnection between respective terminals and leads and a clamping mechanism for holding the upgraded circuit module, the connector, and the pre-existing electronic component together to maintain the electrical interconnection.

7 Claims, 7 Drawing Sheets

ELECTRONIC COMPONENT UPGRADE CONNECTOR AND CONTACT

FIELD OF THE INVENTION

The invention relates to an electrical connector for providing a separable electrical interconnection between the leads extending from a pre-existing electronic component and a circuit module.

BACKGROUND OF THE INVENTION

The technology of the electronics industry, especially in the computer industry, is improving so rapidly that the new equipment has such desirable features that the old equipment is rendered essentially obsolete well before the end of its designed lifespan. When this happens the old equipment is normally scrapped, wasting a significant amount of still useful components.

Presently, one electronic component that is evolving rapidly is the micro-processor, a component that is contained within devices ranging from the personal computer to industrial controllers. The new micro-processors allow the user to accomplish tasks in a way that were not imagined just a couple of years ago, thereby making them very desirable and the devices containing the older micro-processors essentially worthless. One way to take advantage of the still useful components within the old equipment is to upgrade the micro-processor, giving the old equipment capability close to that of the newer equipment.

There are numerous ways to approach the problems associated with upgrading the micro-processor which generally has leads soldered directly to a printed circuit board. One method is that the old micro-processor can be removed from the board by desoldering and the new microprocessor can be resoldered in its place. However, this is difficult to accomplish, especially in the field, due to the high density of leads associated with the micro-processors.

Another method would be for the manufacturer to incorporate chip carrier sockets onto the printed circuit board during manufacture that would allow a user to change micro-processors without soldering. However, a problem with this approach is that incorporating sockets onto the printed circuit board must be done at the time of manufacture or the same problems associated with resoldering exist. The use of sockets adds expense to the end product because of the additional cost of the socket and the additional costs of assembly. Another problem, inherent in both of the above solutions, is there is no way to accommodate upgrades that have a different lead configurations.

What is needed is a user-friendly connector that can be installed by an end-user in the field for connecting an upgraded micro-processor component directly over the existing micro-processor, disabling it, and running the system through the upgraded component.

SUMMARY OF THE INVENTION

The present invention is a connector for electrically interconnecting terminals of a circuit module, for example a multi-component micro-processor upgrade located above a pre-existing electronic component such as an existing micro-processor, to respective leads extending from the pre-existing electronic component, where the leads are affixed to respective contact pads on a substrate, such as a printed circuit board. The connector has a frame with opposing side portions that generally encompass the pre-existing electronic component, at least where the leads extend therefrom. These side portions have a plurality of channels correspondingly spaced to the terminals of the circuit module and the leads of the pre-existing electronic component. A plurality of contacts are individually retained within at least some of the channels for electrically connecting the terminals to their respective leads. Each contact has a first contact portion for establishing a separable electrical connection with the lead of the pre-existing electronic component as the connector is mated therewith and a second contact portion for establishing an electrical connection with the respective terminal of the circuit module as the connector is mated therewith. The connector also incorporates a mechanism for maintaining the circuit module, the connector, and the pre-existing electronic package in the proper mating relation, whereby the connector establishes an electrical interconnection from the terminals of the circuit module, through the contacts of the connector, to the respective leads of the pre-existing electronic component and through to the corresponding contact pads of the substrate.

It is an object of this invention to provide a connector for providing a separable electrical interconnection between the leads extending from a pre-existing electronic component mounted upon a substrate and the terminals of a circuit module. It is another object of this invention to provide a connector than can be easily installed in the field. It is yet another object of this invention to provide a contact for use with the connector that minimizes the potential for damaging the electrical interface between the leads of the pre-existing electronic component and the substrate while still providing a reliable electrical connection.

It is a feature of this invention that the contact may be compliantly engaged to both the lead of the pre-existing electronic component and the terminals of the circuit module. It is another feature of this invention that a first contact portion establishes a separable electrical connection with the lead of the pre-existing electronic component and a second contact portion may be adapted to establish an electrical connection with the respective terminal of the circuit module through various types of interfaces. It is yet another feature of this invention to have a mechanism for maintaining the circuit module, the connector, and the pre-existing electronic package in proper mating relation.

It is an advantage of this invention that a wiping interface with the leads of the pre-existing component may be established by the contact allowing for a separable interconnection. It is another advantage of this invention that the contact may include a back-up arm for retainably positioning the contact within the contact frame.

DETAILED DESCRIPTION OF THE INVENTION

Figure 1:
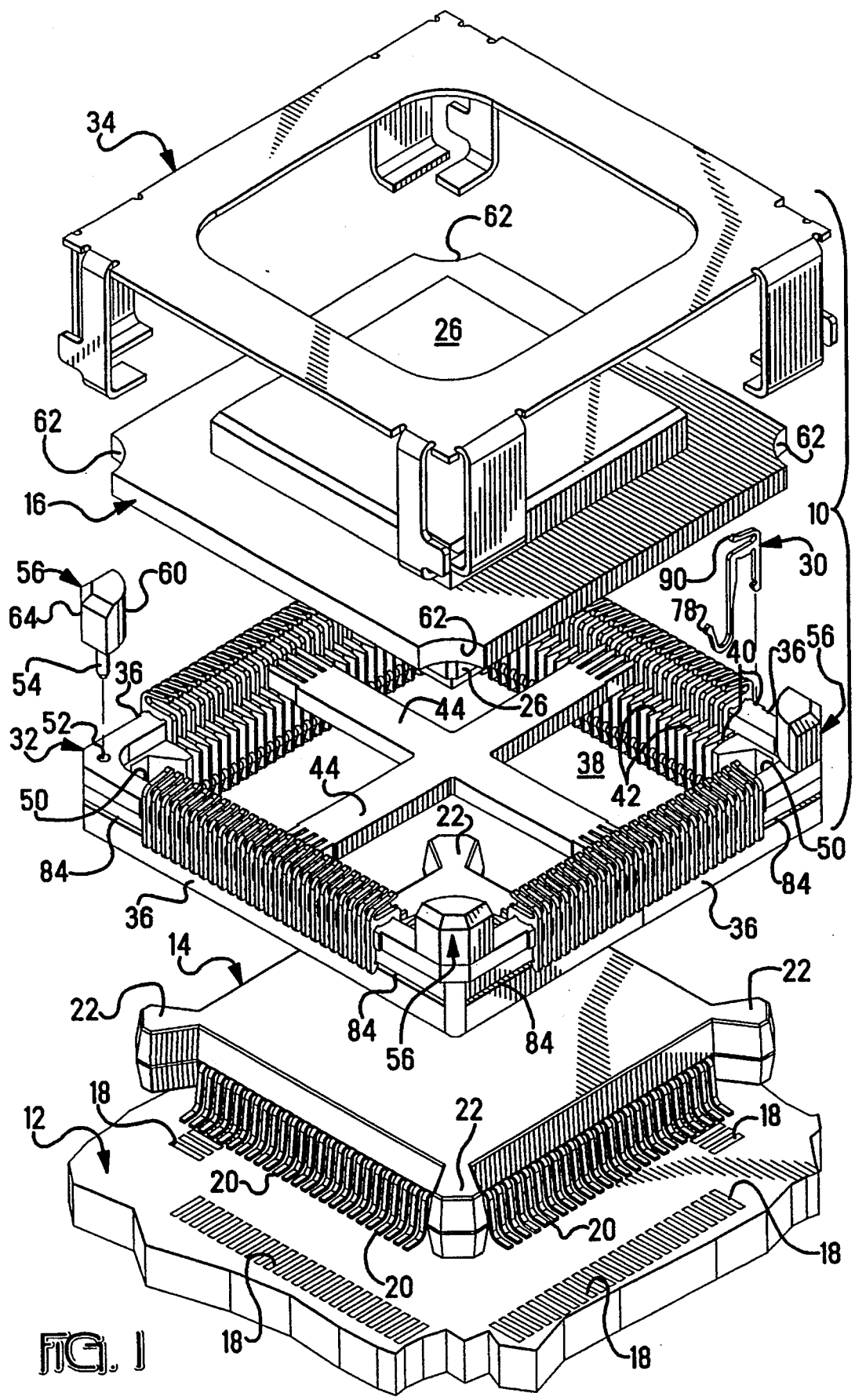
FIG. 1 is a partially exploded upper perspective view of the connector and the associated components.
Figure 2:
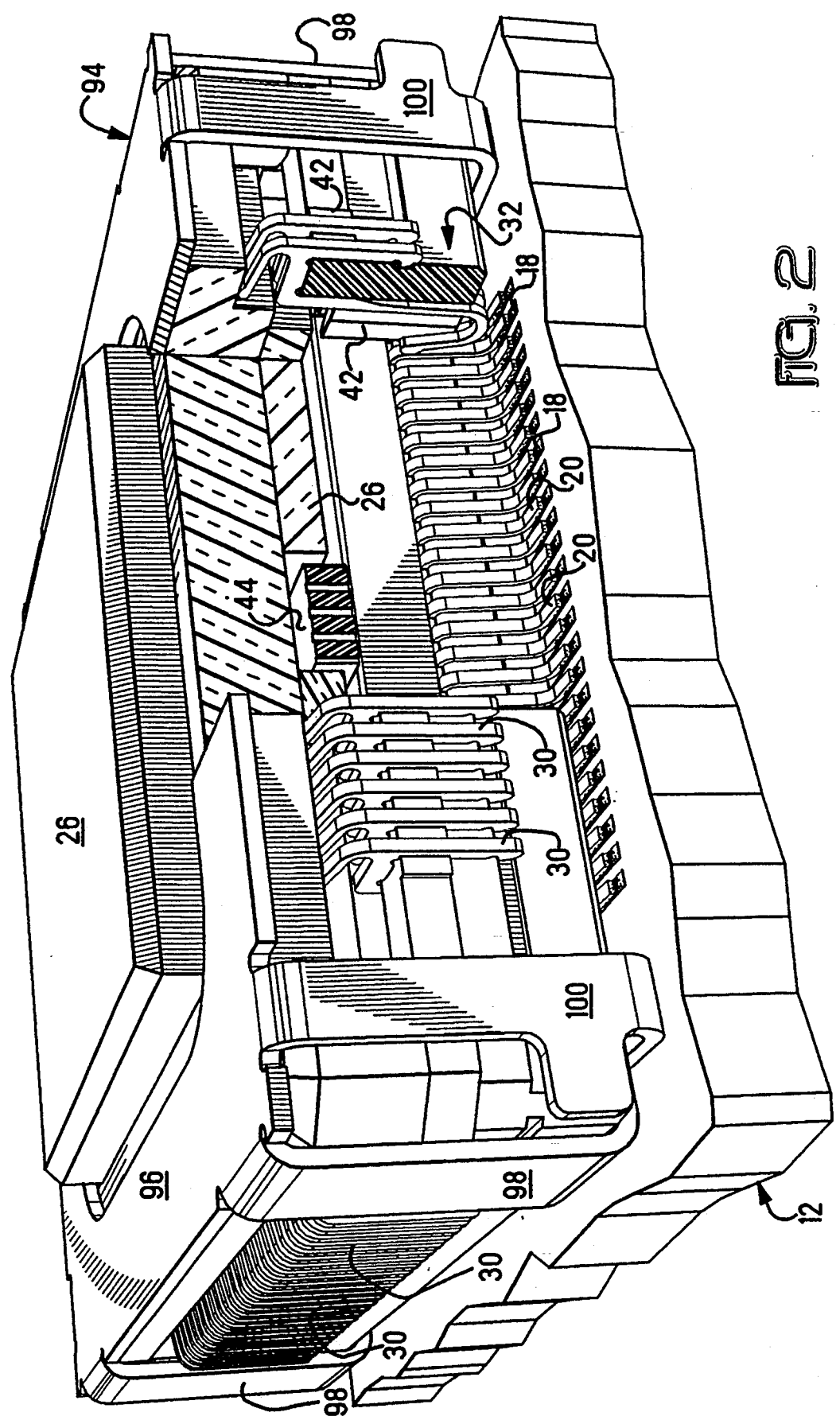
FIG. 2 is a partial cut-away perspective view of the assembled connector.

FIG. 1 shows an electrical connector 10 of the present invention along with a substrate 12, a pre-existing electronic component 14 and a circuit module 16. The substrate 12 may be, for example, a printed circuit board having a plurality of contact pads 18 for electrical interconnection with leads 20 that extend from the pre-existing electronic component 14. As an example, the pre-existing electronic component 14 may be a computer micro-processor packaged in a Plastic-Quad-Flat-Pack (PQFP) having a plurality of gull-wing leads 20 extending from the perimeter and four corner bumpers 22. The electrical connection with the substrate 12 may be a soldered joint 24, established through standard surface mounting techniques, or it may be any of a number of other types of joints.

Figure 3:
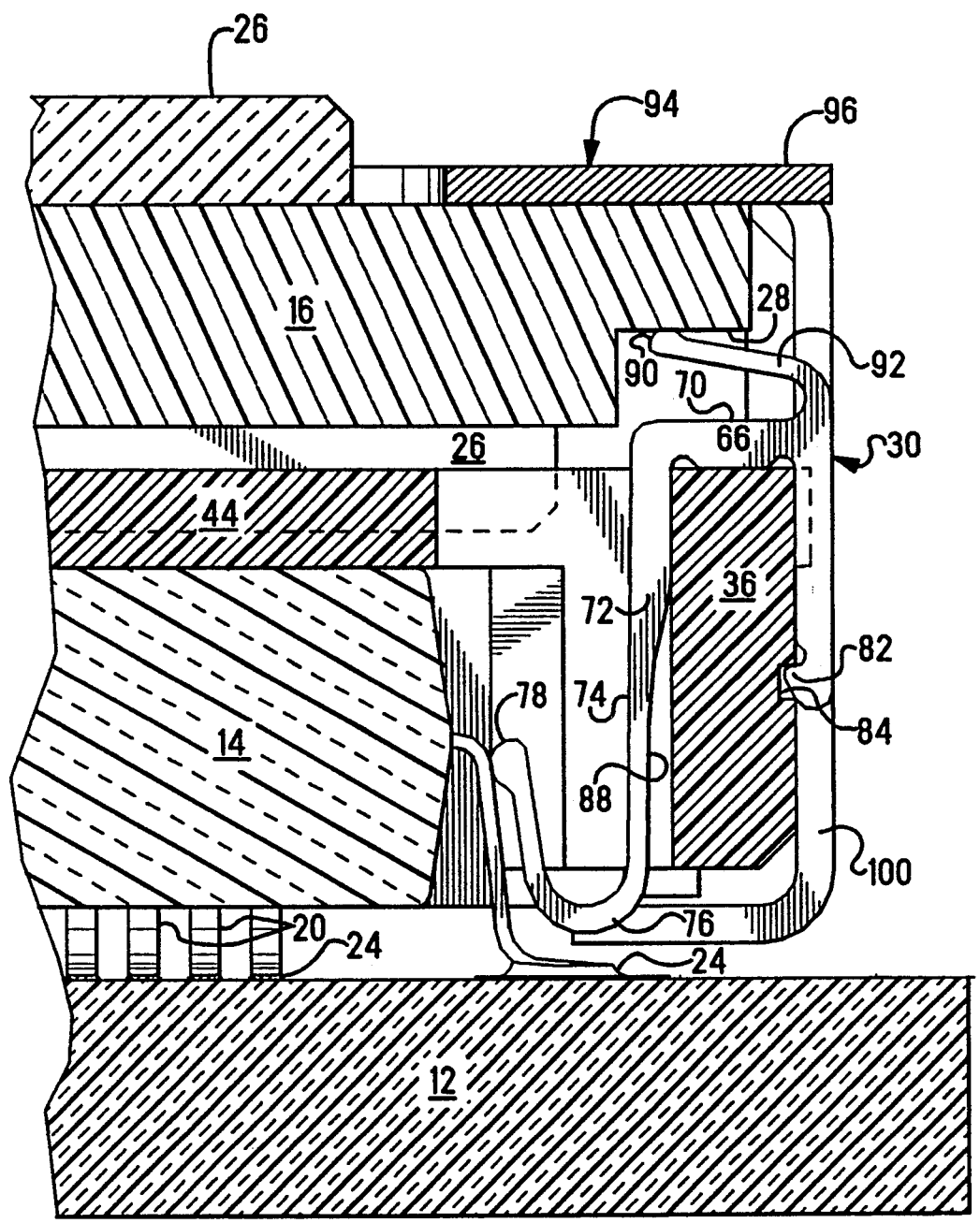
FIG. 3 is a cross-sectional view of the assembled connector.
Figure 4:
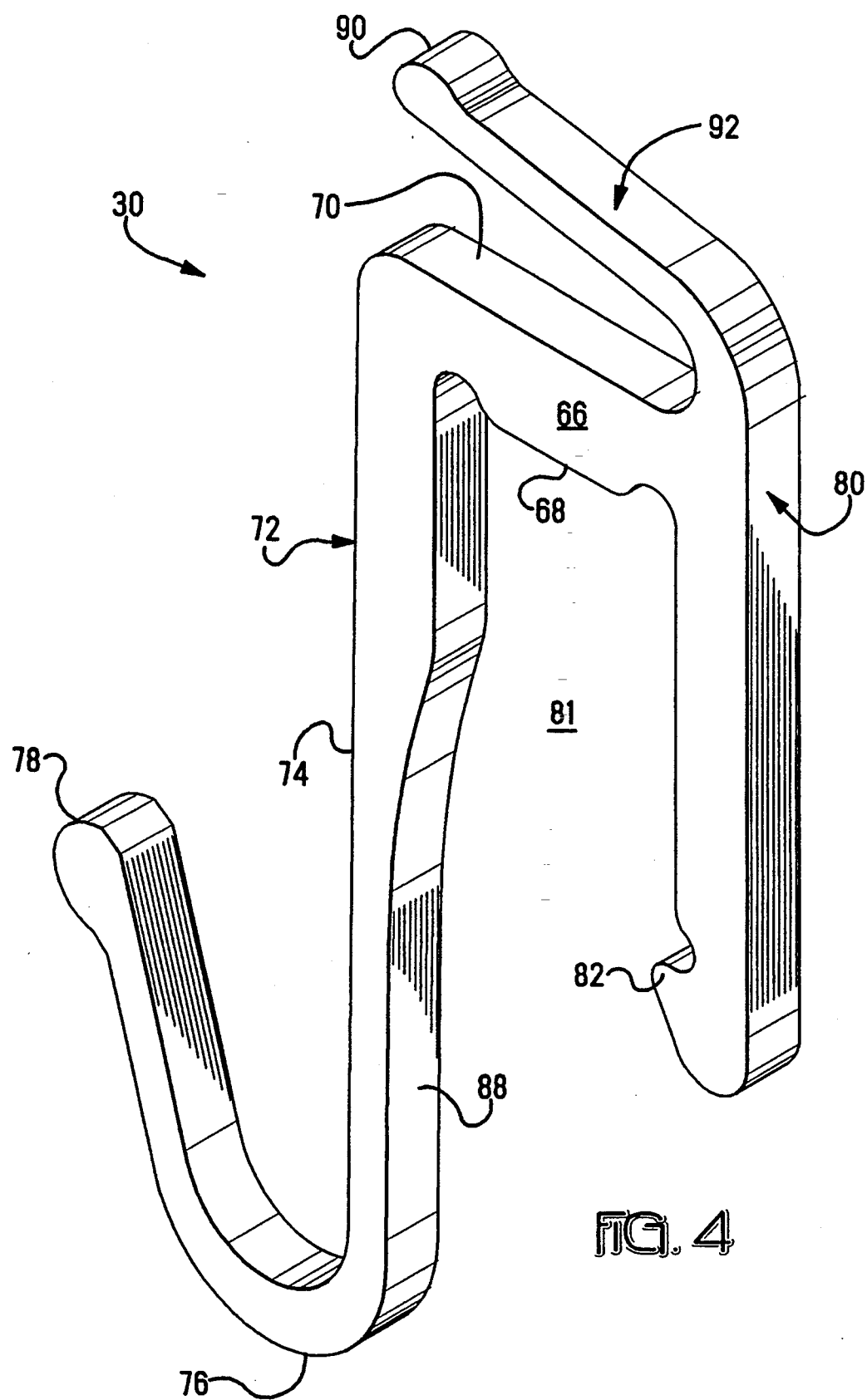
FIG. 4 is a perspective view of the contact.

The circuit module 16 may be a multi-component module having a plurality of electronic components 26 disposed on one or both sides of the module 16 of a multi-layered printed circuit board or it may be a single electronic component 26 attached to a printed circuit board through the use of a chip socket (not shown). These electronic components 26 are electrically connected to terminals 28 (best shown in FIG. 3) corresponding to at least some of the leads 20 of the pre-existing electronic component 14. These terminals 28 are constructed electrical interconnection, for example through wiping, through-hole or surface mount techniques.

The connector 10 incorporates a plurality of contacts 30 into a frame 32 that will be located between the pre-existing electronic component 14 and the circuit module 16 in order to electrically interconnect the terminals 28 to the leads 20. A mechanism 34 for maintaining the circuit module 16, the connector 10, and the pre-existing electronic component 14 in proper mating relation is also included.

The connector frame 32 has opposing side portions 36 that define a cavity 38 for accepting the pre-existing electronic component 14, whereby the side portions 36 generally surround the pre-existing electronic component 14 along the leads 20. The side portions 36 have a plurality of channels 40 that are in a spaced alignment with at least the terminals 28 and the respective leads 20 that are desired to be interconnected. The channels 40 are constructed to individually receive the contacts 30 and are defined by a series of spaced apart webs 42 on the side portions 36.

The side portions 36 are interconnected across the cavity 38 by stiffeners 44 that provides additional rigidity to the side portions 36. Although not required, the bottom surface 46 of the stiffener may locate the connector 10 above the pre-existing electronic component. This could also be accomplished by having tabs (not shown) extend into the cavity 38 from the side portions 36 if stiffeners 44 were not used. As used in this application, the relationship of the components is to be viewed relative the substrate 14 as it is recognized that the substrate 14 could mounted in various orientations (for example, vertically or horizontally), thereby changing orientation of the components.

The frame 32 also has a keying feature 50 for maintaining the channels 40 of the side portions 36 in their proper position relative to the leads 20 of the pre-existing circuit component 14. The keying feature 50 illustrated is a cut-out in the opposing side portions 36 shaped to correspond to the bumpers 22 of the pre-existing circuit component 14 and sized to receive the bumper 22 in as close a sliding fit as necessary to maintain proper the alignment with the leads 20. Other keying features 50 may be incorporated depending on the configuration of the pre-existing circuit component 14.

The frame 32 also incorporates orientation features 52 for positioning the circuit module 16 relative the frame 32. The orientation feature 52 shown is a hole that is constructed to closely receive a first end 54 of a pin 56. A second end 58 of the pin has a cylindrical surface 60 formed to fit closely with a circular cutout 62 in the circuit module 16, thereby closely aligning the terminals 28 of the circuit module 16 with the channels 40 of the side portions 36. Opposite the cylindrical surface 60, the pins 56 have a multi-faceted relief surface 64 formed to prevent interference with the other components of the connector 10.

Typically, the frame 32 will be molded from a dielectric material. The mold may incorporate the features mentioned above or they may be machined into the frame 32 after the molding process. For example, the pins 56, used to orientate the circuit module, may be a molded-in feature of the frame 32.

The contacts 30 are constructed for electrically interconnecting the terminals 28 of the circuit module 16 to the respective leads 20 extending from the pre-existing electronic component 14. The contact 30 is constructed to be retainably positioned within the channels 40 that are defined by the webs 42 on the side portions 36 of the frame 32. The contact 30 may be stamped from various metals and then plated to establish the desired mechanical properties and electrical conduction properties.

The contact 30 has a base 66 with a first side 68 and a second side 70. From the first side 68, a contact arm 72 extends along a generally straight section 74 before merging into a bent back portion 76 that includes a first contact portion 78 constructed for wiping engagement with the lead 20. Also extending from the first side 68 is a back-up arm 80 adapted to retainably position the contact 30 to the frame 32 in one of the plurality of channels 40. An opening 81 is defined between the contact arm 72 and the back-up arm 80 that is sized to receive the side portion 36 of the frame 32. When the contact 30 is placed on the side portion 36, within one of the channels 40 (as best observed in FIG. 3), a hook 82 on the back-up arm 80 engages a recess 84 on the side portion 36.

The first contact portion 78 is positioned on the contact arm 72 to engage the lead 20 as far as possible from the solder joint 24 of the leads 20 of the pre-existing electronic component 14 and the contact pads 18 of the substrate 12. This is to minimize the stresses imposed on the solder joint 24, which due to its ductile nature is especially susceptible to creep when subjected to a constant force, when establishing the wiping engagement with the lead 20. Not only does this positioning of the first contact portion 78 take advantage of compliance in the leads 20, it also positions the first contact portion 78, and therefore the forces acting inward against the lead 20, as close as possible to a portion 86 of the lead 30 that extends in an essentially horizontal orientation, thereby minimizing the resultant forces exerted on the solder joint.

The straight section 74 of the contact arm 72 has a relieved section 88 that enables the contact arm 72 to exhibit some compliance while maintaining positive retainment within the channel 40 and sufficient stiffness to enable the wipe to occur as the connector 10 is mated to the pre-existing component 14. In order to achieve the desired compliance, the generally straight section 74 of the contact arm 72 extends beyond where the wiping interconnection occurs before the bent back portion 76 establishes the interconnection in the desired location. By extending the generally straight section 74 as far as possible without interfering with other components, the contact arm 72 is provided with its maximum compliance.

As the first contact portion 78 is compliantly pushed back by engagement with the lead 20, exerting both a force and a torque on the side portion 36. These are transmitted into the side portion 36 by its close fit within the opening 80 and the engagement of the hook 82 with the recess 84. The stiffeners 44 counter-act the resultant forces and the torque from distorting the side portions 36.

Figure 5:
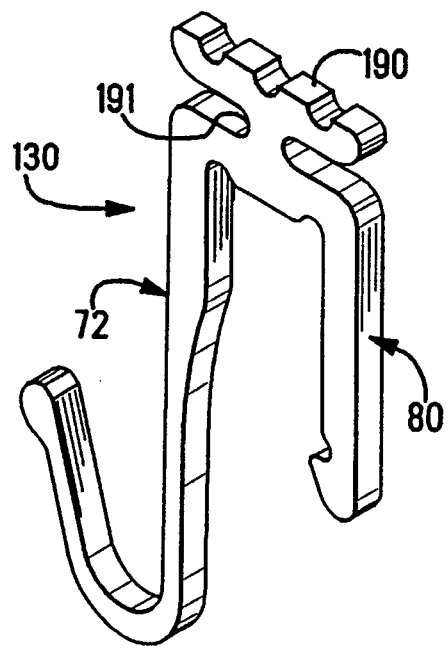
FIG. 5 is a perspective view of an alternative embodiment of the contact.
Figure 6:
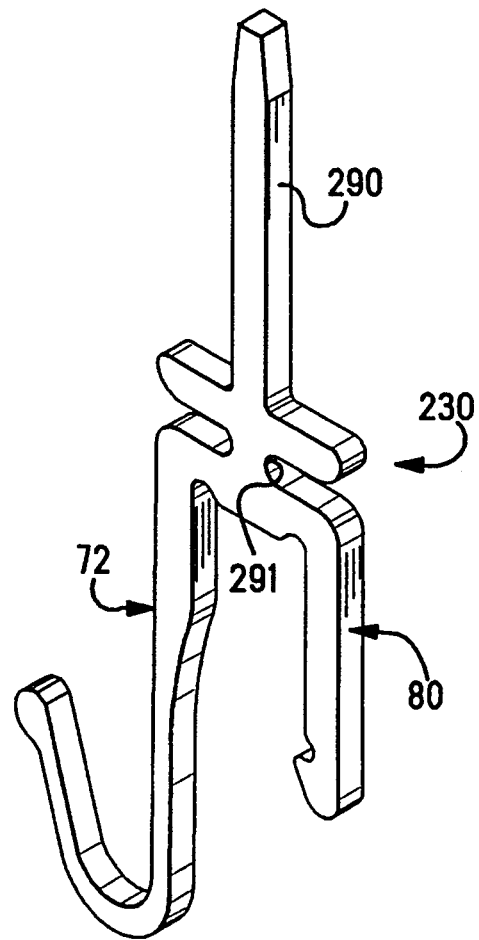
FIG. 6 is a perspective view of yet another alternative embodiment of the contact.
Figure 7:
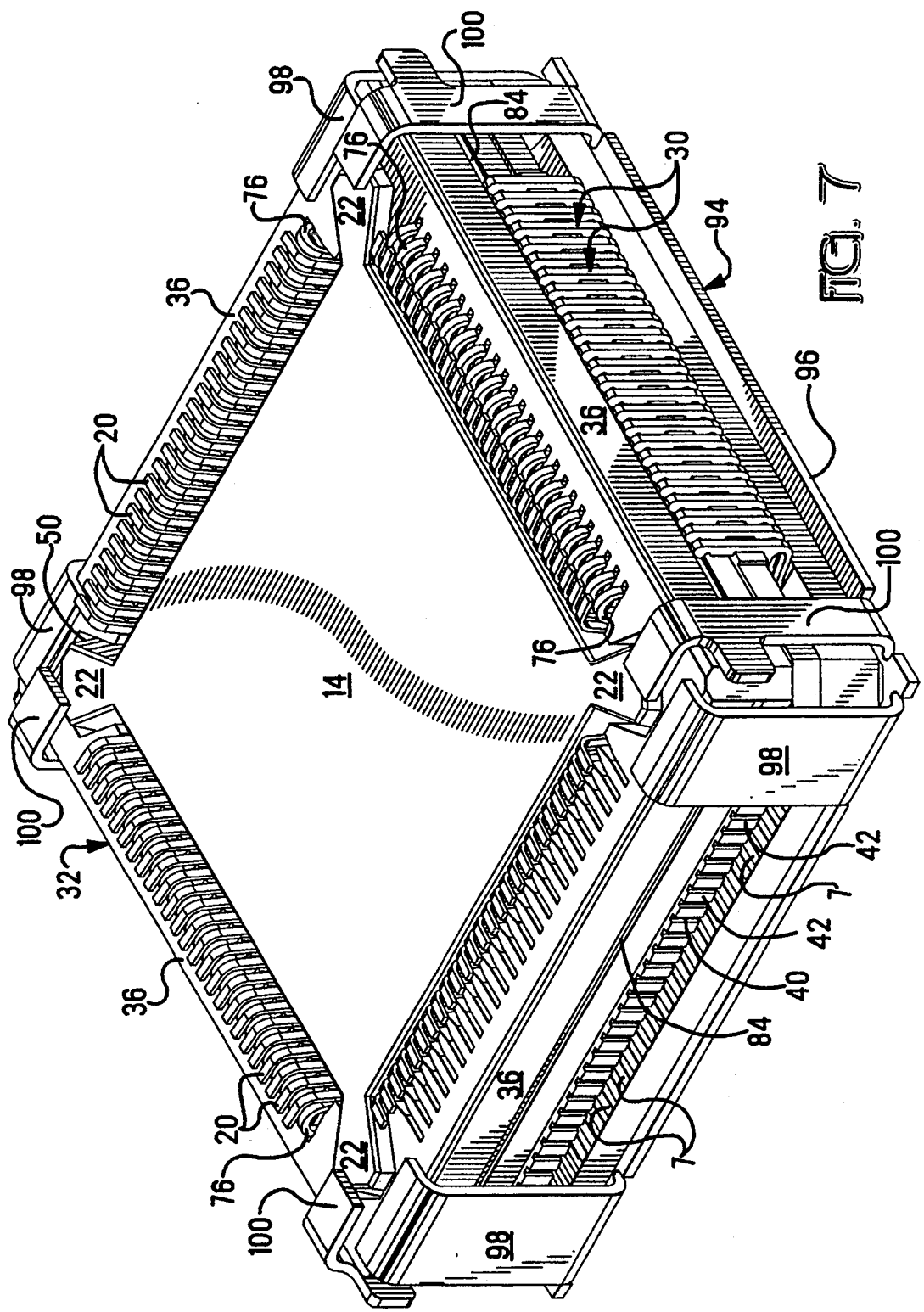
FIG. 7 is a lower perspective view of the assembled connector with one row of contacts removed.

Extending above the second side 70 of the base 66 of the contact 30 is the second contact portion 90 incorporated into a second contact arm 92 for establishing a wiping engagement with the terminal 28 of the circuit module 16. As the second contact arm 92 is deflected downward by the circuit module 16, the second contact portion 90 wipes the terminal 28 to provide the electrical interconnection. This second contact arm 92 and second contact portion 90 can be adapted for a number of different types of electrical interconnections with the circuit module 16. FIG. 5 shows a contact 130 that has second contact portion 190 adapted for a surface mounting solder connection to the terminals 28 of the circuit module 16 connected with the second side 70 of the base 66 by a resilient web 191. FIG. 6 shows a similar contact 230 that has a pin 290 as the second contact portion mounted on top of a resilient web 291 and adapted for plated-through-hole or soldered through-hole terminals. The resilient webs 191, 291 of these alternative connector embodiments 130, 230 provide the compliance at the interconnection that is inherent in the wiping connection to accommodate slight manufacturing inconsistencies and varying thermal expansions.

Figure 8:
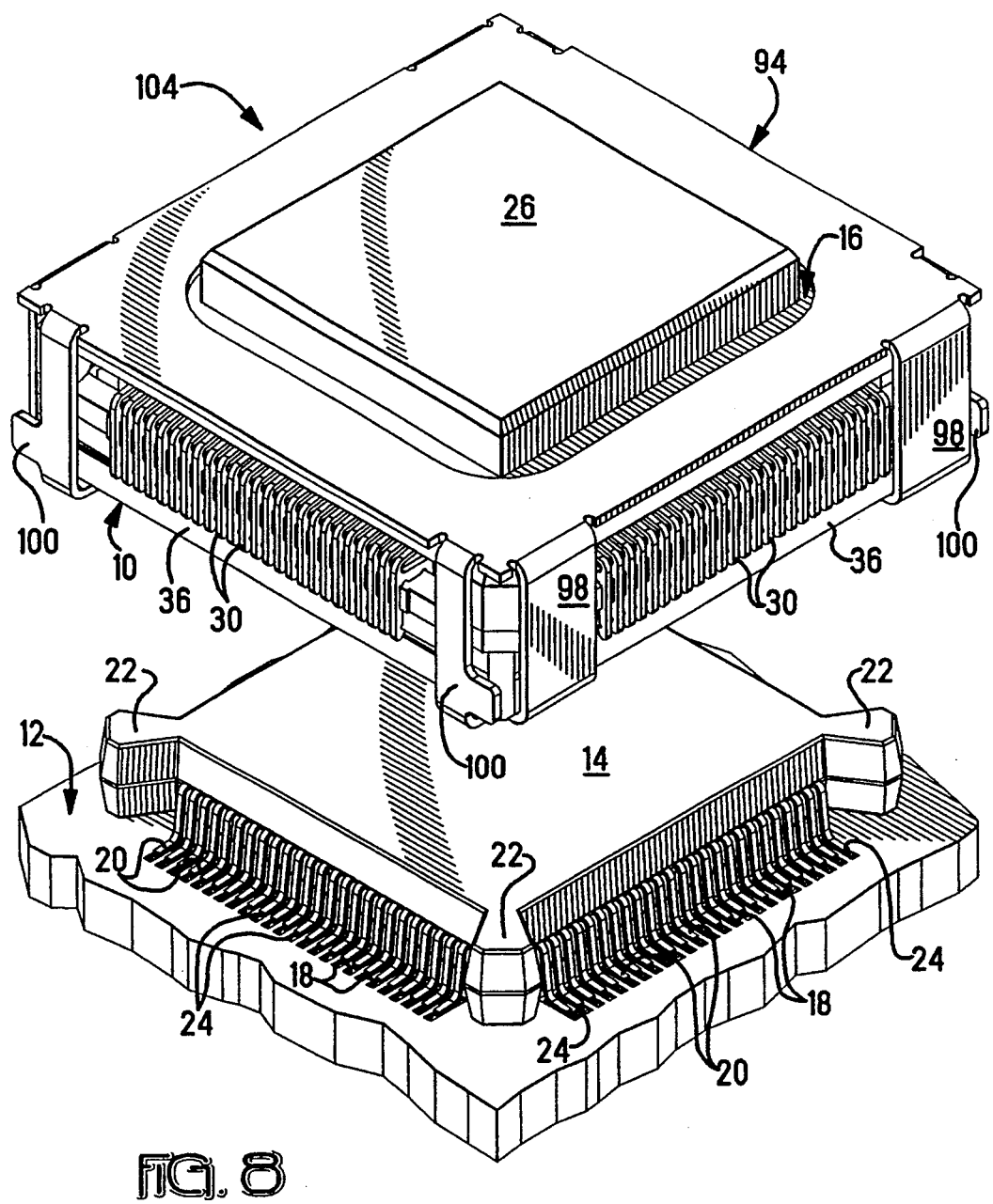
FIG. 8 is a perspective view of a package that includes the connector and circuit module as might be received by the end-user for installation.

The connector 10 also includes a mechanism 34 for maintaining the circuit module 16, the connector 10, and the pre-existing electronic component 14 in proper mating relation so that the electrical interconnection is established from the terminals 28 of the circuit module 16, through the contacts 30 of the connector 10, to the respective leads 20 of the pre-existing electronic component 14 and through to the corresponding contact pads 18 of the substrate 12. The clamping mechanism 34 shown in the drawings is a clip 94. The clip 94 has a plate 96 constructed to fit upon the circuit module 16 without interfering with the components 26 thereupon. First grippers 98 extend from the plate 96 and are constructed to hold the frame 32 of the connector 10 tightly to the circuit module 16 by fitting tightly under the frame 32, as best seen in FIG. 8. These first grippers 98 assure that the second contact portion 90 of the contact 30 remains in electrical engagement with the terminals 28 of the circuit module 16. Second grippers 100 also extend from the plate 96 and are constructed to fit under the bumpers 22 of the pre-existing electronic component 14. These second grippers 100 assure that a package 104 that includes the circuit module 16 and the connector 10 is held tightly to the pre-existing electronic component 14. It may be necessary to spread these second grippers 100 slightly during installation to clear the bumpers 22 as the package 104 is placed on the pre-existing electronic component 14.

The clip 94 may be constructed from a thin piece of metal that could be spring tempered. The grippers 98, 100 are sections of the thin piece of metal that are bent under each of which have a clasp 102 formed by an additional bend to engage the respective components 10, 14. The clip 94 may also be molded from plastic.

It is envisioned that if one of the two alternative contact designs 130, 230 are used, it may not be necessary to hold the circuit module 16 to the frame 32 because the second contact portion 90 of the contact 30 may be soldered to the terminal 28. This soldered joint could serve the function of the first grippers 98 and, therefore is envisioned to be part of the mechanism 34 to hold the circuit module 16, the connector 10, and the pre-existing electronic component 14 together.

The circuit module 16 and the connector 10 can be shipped by the manufacture to an end-user in a partially assembled state, as shown in FIG. 8. The circuit module 16 may be mounted onto the connector 10, in a manner consistent with the second contact portion 90 of the contact 30. In the embodiment shown, the circuit module 16 would be positioned to the frame 32 by the orientation features 52 and the electrical connection between the terminals 28 and the second contact portion 90 would be established as the circuit module 16 is mated to the connector frame 32 by the first grippers 98 of the clip 94.

When the end-user receives this package 104 in the field, the pre-existing electronic component 14 may be disabled, if required, and the package 104 attached. The keying features 50 orientate the contacts 30 within the connector 10 to the leads 20 of the pre-existing electronic component 14 by receiving the bumpers 22 of the pre-existing electronic component 14. The package 104 is then mated to the pre-existing electronic component 14 establishing a separable and wiping electrical connection between the leads 20 and the first contact portion 78. The second grippers 100 are then engaged on the bumpers 22 of the pre-existing electronic component 14, maintaining the electrical interconnection between the leads 20 and the contact 30.

It will be appreciated that the present invention has significant advantages for connecting a the terminals of a circuit module to the leads of a pre-existing electronic component. It should be recognized that the above-described embodiments, of the contact and the connector, constitute the presently preferred form of the invention and that the invention may take numerous other forms. Accordingly, the invention should be only limited by the scope of the following claims.

I claim:

1. A connector for electrically interconnecting terminals of a circuit module located above a pre-existing electronic component to respective leads extending from the pre-existing electronic component, where the leads are affixed to respective contact pads on a substrate, the connector comprising:

a frame that generally encompasses the pre-existing electronic component;

a plurality of contacts, received by said frame, and a mechanism for maintaining the circuit module, the connector, and the pre-existing electronic component in proper mating relation;

whereby, an electrical interconnection is established between respective terminals and contact pads by way of the leads and the contacts, wherein said mechanism comprises a clip disposed about the module and having a plurality of first grippers extending therefrom to hold said frame tightly to the module and a plurality of second grippers to hold the pre-existing electronic component tightly to said frame.

2. The connector of claim 1, wherein said frame has orientation features engaged by pins that cooperate with the module, thereby maintaining the module and the associated terminals in precise alignment with said frame and said contacts therein.

3. The connector of claim 1, wherein said frame has keying features for receiving the pre-existing electronic component.

4. The connector of claim 1, wherein said frame includes opposing side portions that define a cavity, said opposing side portions further including a lip extending into the cavity to cooperate with the pre-existing electronic component to position the connector thereabove.

5. The connector of claim 4, wherein said opposing side portions have a plurality of channels therealong that corresponding to the leads of the pre-existing electronic component, said contacts being individually received within at least some of the channels.

6. The connector of claim 5, wherein each said contacts includes a base, a contact arm extending from the base, a backup arm extending from the base to define an opening, wherein said openings are received by said frame.

7. A connector for electrically interconnecting terminals of a circuit module located above a pre-existing electronic component to respective leads extending from the pre-existing electronic component where the leads are affixed to respective contact pads on a substrate, the connector comprising:

a frame having opposing side portions generally encompassing the pre-existing electronic component, the side portions having a plurality of channels correspondingly spaced to the terminals of the circuit module and the leads of the pre-existing electronic component;

a plurality of contacts individually retained within a least some of the channels for electrically connecting the terminals to their respective leads, each contact having a base having a first side and a second side;

a resilient contact arm extending from said first side and including a first contact portion for establishing a separable electrical connection to leads of the pre-existing electronic component, said contact arm being adapted to deflect upon engagement with the lead, a back-up arm extending from said first side, defining an opening between said contact arm and said back-up arm wherein said opening is received by said frame, said back-up arm being adapted to retain said contact within the channel; and a second contact portion extending from the second side of said base to establish an electrical connection; and a clip disposed about the module and having a plurality of first grippers extending therefrom to hold said frame tightly to the module and a plurality of second grippers to hold the pre-existing electronic component tightly to said frame.

* * * * *